United States Patent [19]

Kakimi

[11] Patent Number: 4,933,256

[45] Date of Patent: Jun. 12, 1990

[54] IMAGE-FORMING METHOD EMPLOYING LIGHT-SENSITIVE MATERIAL HAVING MICROCAPSULES AND FINE POLYMER PARTICLES AND IMAGE-RECEIVING MATERIAL

[75] Inventor: Fujio Kakimi, Kanagawa, Japan

[73] Assignee: Fuji Photo Film Co., Ltd., Kanagawa, Japan

[21] Appl. No.: 194,609

[22] Filed: May 16, 1988

[30] Foreign Application Priority Data

May 15, 1987 [JP] Japan ................. 62-118552

[51] Int. Cl.$^5$ .................. G03C 1/68; G03C 1/72
[52] U.S. Cl. ................. 430/138; 430/203; 430/253; 430/254; 430/270; 430/281
[58] Field of Search ............ 430/138, 203, 253, 254, 430/281, 270

[56] References Cited

U.S. PATENT DOCUMENTS

| | | | |
|---|---|---|---|
| 3,625,736 | 12/1971 | Matsukawa et al. | 503/207 |
| 4,629,676 | 12/1986 | Hayakawa et al. | 430/203 |
| 4,735,884 | 4/1988 | Tsukahara et al. | 430/138 |
| 4,753,862 | 6/1988 | Sato et al. | 430/138 |
| 4,758,496 | 7/1988 | Kakimi | 430/138 |
| 4,760,011 | 7/1988 | Kakimi | 430/138 |
| 4,761,360 | 8/1988 | Sato et al. | 430/138 |
| 4,764,451 | 8/1988 | Ishikawa | 430/138 |
| 4,772,531 | 9/1988 | Tsukahara et al. | 430/138 |
| 4,784,932 | 11/1988 | Nakamura et al. | 430/138 |
| 4,797,343 | 1/1989 | Nakamura | 430/138 |
| 4,822,717 | 4/1989 | Nakamura | 430/138 |

*Primary Examiner*—Paul R. Michl
*Assistant Examiner*—Patrick A. Doody
*Attorney, Agent, or Firm*—Sughrue, Mion, Zinn, Macpeak & Seas

[57] ABSTRACT

An image-forming method comprises:
  imagewise exposing to light a light-sensitive material which comprises a light-sensitive layer provided on a support, the light-sensitive layer containing microcapsules which contain silver halide, a reducing agent and a polymerizable compound and polymer particles having a mean particle size in the range of 5 to 50 μm and a softening point in the range of 80° to 180° C., to form a latent image of the silver halide in the light-sensitive layer;
  simultaneously or thereafter developing the light-sensitive material to imagewise polymerize the polymerizable compound in the light-sensitive layer; and
  pressing with heating the light-sensitive material on an image-receiving material comprising an image-receiving layer on a support under the condition that the light-sensitive layer of the light-sensitive material faces the image-receiving layer of the image-receiving material, to transfer the unpolymerized polymerizable compound to the image-receiving material.

9 Claims, No Drawings

IMAGE-FORMING METHOD EMPLOYING LIGHT-SENSITIVE MATERIAL HAVING MICROCAPSULES AND FINE POLYMER PARTICLES AND IMAGE-RECEIVING MATERIAL

FIELD OF THE INVENTION

This invention relates to an image-forming method utilizing a light-sensitive material and an image-receiving material.

BACKGROUND OF THE INVENTION

Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632 and 58(1983)-169143 describe image-forming methods comprising exposing to light a light-sensitive material which comprises a light-sensitive layer containing silver halide, a reducing agent and a polymerizable compound provided on a support. In these image-forming methods, when the exposed silver halide is developed using a developing solution, the polymerizable compound is caused to polymerize in the presence of a reducing agent (which is oxidized) to form a polymer image. Thus, these methods need a wet development process employing a developing solution. Therefore the process takes a relatively long time for its operation.

An improved image-forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image-forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to light to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image-forming methods are based on the principle in which the polymerizable compound is polymerized within the area where a latent image of the silver halide has been formed.

Further, Japanese Patent Provisional Publication No. 61(1986)-260241 describes an image-forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound within the other area (unexposed area) is polymerized.

Japanese Patent Provisional Publications Nos. 61(1986)-275742 and 61(1986)-278849 describe examples of the light-sensitive materials, which employ microcapsules containing at least two components of the light-sensitive layer, that is polymerizable compound and a color image forming substance. The light-sensitive material having such a structure has an advantage of giving an image of high quality.

The light-sensitive layer is prepared by arranging microcapsules containing the above-mentioned components on a support. In the preparation of the light-sensitive material, when a continuous light-sensitive material is rolled or cut into a desired length, a surface of the light-sensitive material is damaged by contact or friction with other material, whereby the microcapsules are ruptured. In the image-forming method utilizing the light-sensitive material, the light-sensitive material is developed by heating simultaneously with or after the imagewise exposure to obtain a latent image, and then is pressed on an image-receiving material to transfer the latent image onto the image-receiving material. When the light-sensitive material having the ruptured capsules is utilized for the above described image-forming method, a white background area of the transferred image is stained (i.e., smudged) by insufficiently cured polymerizable compound. Accordingly, the clearness of the obtained image lowers.

The above-mentioned problem is also observed in the use of the conventional pressure-sensitive and heat-sensitive recording materials. In the use of these conventional recording materials, various methods have been proposed to solve the problem. For instance, methods employing fine particles of starch or the like (i.e., antismudging agent) are described in Japanese Patent Publication No. 47(1972)-1178 (corresponding to British Pat. No. 1,232,347). A method employing hollow resin particles having thermal expansion property is described in Japanese Patent Provisional Publication No. 48(1973)-32013 (corresponding to U.S. Pat. No. 3,867,169). A method employing a polyolefin fine powder is described in Japanese Patent Provisional Publication No. 54(1979)-51611 (corresponding to British Pat. No. 200,681). A method employing a cellulose fine powder is described in Japanese Patent Provisional Publication No. 60(1985)-224581.

The present inventor has found that the above-mentioned methods employing the fine particles or the powder in combination with the microcapsules in the light-sensitive material show an advantage in preventing the smudging. However, according to study of the inventor, in the case that the unpolymerized polymerizable compound of the light-sensitive material is transferred to the image-receiving material, an optical density of the image is apt to lower.

SUMMARY OF THE INVENTION

An object of the present invention is to provide an image-forming method which forms on an image-receiving material a clear image having a high maximum density.

There is provided by the present invention an image-forming method which comprises:

imagewise exposing to light a light-sensitive material which comprises a light-sensitive layer provided on a support, said light-sensitive layer containing microcapsules which contain silver halide, a reducing agent and a polymerizable compound and fine polymer particles having a mean particle size in the range of 5 to 50 $\mu$m and a softening point in the range of 80° to 180° C., to form a latent image of the silver halide in the light-sensitive layer;

simultaneously or thereafter developing the light-sensitive material to imagewise polymerize the polymerizable compound in the light-sensitive layer; and pressing with heating the light-sensitive material on an image-receiving material comprising an image-receiving layer provided on a support under the condition that the light-sensitive layer of the light-sensitive material faces the image-receiving layer of the image-receiving material, to transfer the unpolymerized polymerizable compound to the image-receiving material.

The present inventor has found that in the above-described image-forming method of the invention which utilizes the specific antismudging agent in the light-sensitive material, a clear image can be obtained, because the area having the minimum optical density (a part of white background) is kept from color staining and the optical density in the part having the maximum optical density is not decreased.

When a light-sensitive material containing the conventional antismudging agent (which generally has a mean particle size larger than that of the microcapsules) is utilized for the image-forming method, the unpolymerized polymerizable compound is insufficiently transferred onto an image-receiving material. Such insufficient transfer is caused by the presence of the antismudging agent. Therefore, the optical density of the image formed on the image-receiving material is low.

In the image-forming method of the present invention, the antismudging agent is deformed, or melted by pressing with heating to turn into a fluid, and enters between the microcapsules or into the support. Therefore, the antismudging agent does not disturb the transfer of the unpolymerized polymerizable compound. Thus, the fine polymer particles of the invention are effective for prevention of smudging. Accordingly, a clear image can be obtained according to the image-forming method of the present invention.

DETAILED DESCRIPTION OF THE INVENTION

The image-forming method of the present invention employs a light-sensitive material containing fine polymer particles (i.e., antismudging agent) having a mean particle size in the range of 5 to 50 μm and a softening point in the range of 80° to 180° C.

The mean particle size of the fine polymer particles is adjusted to match a mean grain size of the microcapsules, and the softening point is adjusted not to inhibit the transfer of the unpolymerized polymerizable compound in the heat development process or heat transferring process.

The mean particle size of the fine polymer particles is preferably in the range of 10 to 30 μm.

There is no specific limitation with respect to material of the fine polymer particles, so long as it has a softening point in the range of 80° to 180° C. The softening point preferably is in the range of 100° to 150° C.

Examples of the polymer material of the fine polymer particles include olefin polymers such as polyolefin (e.g., polyethylene, polypropylene and vinyl chloride/-vinyl acetate copolymer), acid denatured polyolefin (e.g., copolymers of ethylene and acrylic acid, methacrylic acid or maleic acid), and ionomer (ethylene/-sodium or zinc methacrylate copolymers); thermoplastic synthetic polymers such as wax (natural wax and synthetic wax); and polystyrene, polyvinyl chloride and polyvinyl acetate. Known hollow polymers (which are obtainable by heating vinyldene/acrylic acid copolymer particles containing a blowing agent) as described in Japanese Patent Provisional Publication No. 48(1973)-32013. A concrete example thereof is a microsphere (tradename "XD 7059.1" produced by Dow Chemical Corp.). The fine polymer particles can be used singly or in combination.

Fine particles of olefin polymers are preferred. Methods to obtain polyolefin particles having the above defined particle size are described in Japanese Patent Provisional Publication Nos. 50(1975)-36540, 51(1976)-37153, 51(1976)-26950 and 51(1976)-138735.

Since the fine polymer particles coexist with the microcapsules containing a silver halide and other components (i.e., light-sensitive microcapsules, described hereinafter) in the light-sensitive layer, the fine polymer particles preferably have a specific gravity approximate to that of the microcapsules. In the present invention, the fine polymer particles preferably have a specific gravity in the range of 0.9 to 1.3.

The fine polymer particles are contained in the light-sensitive layer in an amount of 1 to 100 weight parts based on 100 weight parts of the microcapsules, and more preferably 5 to 50 weight parts. When the fine polymer particles in the amount of more than 100 weight parts are added to the light-sensitive layer, the obtained image on the image-receiving material (i.e., maximum density) has a low optical density.

In the present invention, the shell of the microcapsules is preferably made of an amino-aldehyde resin. The microcapsules having an amino-aldehyde resin shell are easy to rupture by pressing, whereby the desired image is easily formed on the image-receiving material.

The image-forming method is described below.

Other components than the fine polymer particles which are contained in the light-sensitive material and the image-receiving material for the image-forming method of the present invention are described after the description of the image-forming method.

The image-forming method comprises steps of; the imagewise exposure of the light-sensitive material to light; development; and transference of the unpolymerized polymerizable compound to the image-receiving material.

Various exposure means can be employed in the image-wise exposure, and in general, a latent image of the silver halide is obtained by imagewise exposure to radiation including visible light. The type of light source and exposure can be selected depending on the light-sensitive wavelengths (sensitized wavelength when sensitization is carried out) or sensitivity of silver halide. The original image can be either monochromatic image or color image.

Development of the light-sensitive material can be conducted simultaneously with or after the imagewise exposure. The development can be conducted using a developing solution in the same manner as the image-forming method described in Japanese Patent Publication No. 45(1970)-11149. The image-forming method described in Japanese Patent Provisional Publication No. 61(1986)-69062 which employs a heat development process has an advantage of simple procedures and short processing time because it is performed by the dry process. Thus, the latter method is preferred as the development process of the light-sensitive material.

Heating in the heat-development process can be conducted in various known manners. A heating layer which can be arranged on the light-sensitive material can be used as the heating means in the same manner as the light-sensitive material described in Japanese Patent Provisional Publication No. 61(1986)-294434. The light-sensitive material is preferably heated while suppressing supply of oxygen to the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minute.

Instead of the below-mentioned base or base precursor contained in the light-sensitive material, the development can be proceeds simultaneously with or after addition of a base or a base precursor to the light-sensitive layer. A base sheet (a sheet in which a base is contained) is preferably employed.

During the above development process, a polymerizable compound polymerizes within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

In the image-forming method of the present invention, a polymer image can be formed on the light-sensitive layer in the above process.

After the image exposure, the development and superposing the light-sensitive material on the image-receiving material under pressure with heating to transfer the unpolymerized polymerizable compound to the image-receiving material, a transferred image can be obtained on the image-receiving material. The process for pressing can be carried out in various known manners. In the present invention, the pressure is preferably in the range of 30 to 500 kg/cm$^2$, and more preferably in the range of 100 to 400 kg/cm$^2$. Heating temperature in the transferring procedure is preferably in the range of 40° to 180° C., and more preferably in the range of 80° to 140° C.

In the image-forming method using a developing solution, the fine polymer particles are melted when the light-sensitive material is pressed with heating. Therefore, a clear image can be obtained without decreasing the optical density.

The image-forming method can be used for monochromatic or color photography, printing, radiography, diagnosis (e.g., CRT photography of diagnostic device using supersonic wave), copying (e.g., computergraphic hard copy), etc.

The light-sensitive material and the image-receiving material which can be used for the image-forming method of the invention are described below. In the light-sensitive material used in the invention, a light-sensitive microcapsules containing silver halide, the reducing agent and the polymerizable compound is provided on the support.

There is no specific limitation with respect to silver halide contained in the light-sensitive layer of the light-sensitive material. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Patent No. 100,984) can be employed. A silver halide grain having a core/shell structure in which the silver iodide content in the shell is higher than that in the core can be also employed.

There is no specific limitation on the crystal habit of silver halide grains. For example, a tubular grain having an aspect ratio of not less than 3 can be used.

The silver halide grains preferably have such a relatively low tendency to be fogged that the amount of developed silver is not more than 5 weight % based on the total amount of silver when the unexposed silver halide grains are developed in 1 l of an aqueous developing solution containing 1.0 g of metol, 15.0 g of sodium sulfite, 4.0 g of hydroquinone, 26.7 g of sodium carbonate monohydrate and 0.7 g of potassium bromide.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 $\mu$m, more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 1 g/m$^2$, more preferably in the range of from 1 mg to 500 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, $\alpha$-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291–334 (1977), Research Disclosure No. 17029, pp. 9–15 (Jun. 1978), and Research Disclosure No. 17643, pp. 22–31 (Dec. 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)butyloyl}-2-(p- or o-aminophenyl)hydrazine, 1-{2-(2,5-di-t-pentylphenoxy)butyloyl}-2-(p- or o-aminophenyl)hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2(2,4-di-tert-pentylphenoxy)butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the image-forming method of the invention, a polymerizable compounds having a relatively higher boiling point (e.g., 80° C. or higher) is preferably employed because it is hardly evaporated upon heating. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds. Further, in the case that a transferred image is formed on an image-receiving material, the polymerizable compound preferably has a viscosity of not lower than 100 cP at 25° C.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material employable for the image-forming method of the present invention comprising a light-sensitive layer containing at least the polymerizable compound and the color image forming substance contained in the microcapsule.

There is no specific limitation with respect to the microcapsules, various known manners can be employed (described hereinafter).

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehyde resin, gelatin, epoxy resin, a complex resin containing polyamide resin and polyurea resin, a complex resin containing polyurethane resin and polyester resin.

In the light-sensitive material of the invention, the polymerizable compound (the term, "polymerizable compound" includes the photo polymerizable composition and photo polymerizable compound) is preferably dispersed in the form of oil droplets in the light-sensitive layer. Other components in the light-sensitive layer, such as silver halide, the reducing agent, the color image forming substances may be also contained in the oil droplets.

In the case that silver halide grains are contained in the oil droplets, the oil droplets containing five or more silver halide grains are preferably more than 50% by weight based on the total amount of the oil droplets.

The oil droplets of the polymerizable compound are preferably prepared in the form of microcapsules. There is no specific limitation on preparation of the microcapsules.

In the case that the shell material is composed of a condensed aldehyde resin, the residual aldehyde preferably is not more than 5 mole based on the amount of the reducing agent.

The microcapsules which contains five or more silver halide grains are preferably more than 50% by weight based on the total amount of the microcapsules. The silver halide grains are preferably arranged in the shell material of the microcapsules.

Further, two or more kinds of the microcapsules differing from each other with respect to at least one of the silver halide, polymerizable compound and color image forming substance can be employed. Furthermore, three or more kinds of the microcapsules differing from each other with respect to the color image forming substance is preferably employed to form a full color image.

The mean size of the microcapsule preferably ranges from 0.5 to 50 μm, more preferably 1 to 25 μm, most preferably 3 to 20 μm. The amount of the microcapsules having a particle size of not larger than one sixth part of the average particle size preferably is not more than 1 volume % of the total amount of the microcapsules. Further, the amount of the microcapsules having a particle size of not smaller than twice as large as the average particle size is not more than 1 volume % of the total amount of the microcapsules. Further more, the proportion of an average thickness of the shell of the microcapsules to the average particle size preferably ranges from $0.5 \times 10^{-2}$ to $5 \times 10^{-2}$.

The mean grain size of the silver halide grains preferably is not more than the 5th part of the mean size of the microcapsules, more preferably is not more than 10th part. It is observed that when the mean size of the microcapsules is not less than 5 times as much as the mean grain size of silver halide grains, even and uniform image can be obtained.

The light-sensitive material can be prepared by arranging a light-sensitive layer containing the above-mentioned components on a support. There is no specific limitation with respect to the support. In the case that heat development is utilized in the use of the light-sensitive material, the material of the support preferably is resistant to heat given in the processing stage. Examples of the material employable as the support of the image-receiving material include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support of the image-receiving material, the porous support preferably has such a surface characteristic that a filtered maximum waviness of not less than 4 μm is observed in not more than 20 positions among 100 positions which are determined at random on a filtered waviness curve obtained according to JIS-B-0610. A surface of a paper support preferably has a low water absorptiveness of not more than 3 g/m² which is a value measured according to Cobb test method. A surface of the paper support preferably has such a smooth surface that the smoothness value in terms of the Bekk Smoothness is not less than 300 seconds. A paper support preferably has a low shrinkage ratio of not more than 0.15% both in the machine direction and in the cross direction, wherein the shrinkage ratio is a value measured at the change of relative humidity from 75% to 60%. Further, a paper support preferably has a low air permeability of not less than 300 seconds, wherein the air permeability is a time required for 100 ml of air to pass through the paper support of an area of 645 mm² at pressure of 567 g. Furthermore, a paper support preferably has a pH value in the range of 5 to 9.

Various embodiments of the light-sensitive materials, optional components which may be contained in the light-sensitive layer, and auxiliary layers which may be optionally arranged on the light-sensitive materials are described below.

The light-sensitive layer can further contain optional components such as color image forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, plasticizers, water releasers, binders, photo polymerization initiator, solvent of the polymerizable compound and water soluble vinyl polymers.

The light-sensitive material containing the above-mentioned components can give a polymer image. When the light-sensitive material further contains a color image forming substance as an optional component, the material can give a color image.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substances) employable in the invention include commercially available ones, as well as various known compounds described in the technical publications, e.g., Yuki Gosei Kagaku·Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acidbase reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29-58 (pressure-sensitive copying paper), pp. 87-95 (azo-graphy), pp. 118-120 (heat-sensitive color formation by a chemical change) or in MSS. of the seminer promoted by the Society of Kinki Chemical Industry, "The Newest Chemistry of Coloring Matter-Attractive Application and New Development as a Functional Coloring Matter", pp. 26-32 (Jun. 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

In the case that the color image forming substance comprises two components (e.g., color former and a developer), one component and the polymerizable compound is contained in the microcapsule, and the other component is arranged outside of the microcapsule in the light-sensitive layer, a color image can be formed on the light-sensitive layer.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

In the heat-development process, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an $\alpha$-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inoganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

The base or base precursor can be arranged outside of the microcapsules containing the components of the light-sensitive layer, such as silver halide and polymerizable compound. In this case, the base or base precursor preferably is a hydrophobic compound having melting point of 80° to 180° C. in the form of solid particles.

A base precursor can be used in combination with a catalyst for decomposing the base precursor. For example, a propiolate type base precursor can be used in combination with a catalyst such as silver, copper, a silver compound and a copper compound. Further, the propiolate type base precursor or a sulfonylacetate type base precursor can be used in combination with a hot-melt solvent, which functions as a catalyst for decomposing the base precursor.

In the light-sensitive material, the silver halide, the reducing agent, the polymerizable compound and the color image forming substance are preferably contained in microcapsules and the base or base precursor is preferably arranged outside of the microcapsule in the light-sensitive layer. Further, the base or base precursor can be contained in different microcapsules from those containing the polymerizable compound. The base or base precursor can be contained in the microcapsules under a condition that the base or base precursor is dissolved or dispersed in an aqueous solution of a water retention agent, or under a condition that the base or base precursor is adsorbed on solid particles. The base or base precursor contained in the microcapsules preferably has a melting point in the range of 70° to 210° C.

The base or base precursor can be contained in a layer different from the light-sensitive layer. Further, the base or base precursor can be contained in a porous support.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (including a cyclic amide compound), a thiourea derivative, a thioether compound, a polyethylene glycol derivative, a thiol derivative, an acetylene compound, a sulfonamide derivative and a quarternary ammonium salt.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having —$SO_2$— and/or —CO— group described in U.S. Pat. No. 3,347,675; polar compounds described in U.S. Pat. No. 3,667,959; and 1,10-decanediol, methyl anisate and biphenyl suberate described in Research Disclosure pp. 26-28 (Dec. 1976). The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 62(1987)-70836.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The dyes or pigments can be contained in the light-sensitive layer for the purpose of anti-halation or anti-irradiation. Further, white pigments can be contained in the light-sensitive layer for the purpose of anti-halation or anti-irradiation.

The dyes having a property of being decolorized when it is heated or irradiated with light can be used in the light-sensitive material as a yellow filter layer in a conventional silver salt photographic system.

Binders employable in the light-sensitive material or the image-receiving material may be contained in the light-sensitive layer or the image-receiving layer, and preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

A photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the microcapsule containing the polymerizable compound.

In the case that the water soluble vinyl polymer is used, the polymers are preferably adsorbed on the silver halide grains.

Examples and usage of the other optional components which can be contained in the light-sensitive layer are also described in the above-mentioned publications and applications concerning the light-sensitive material, and in Research Disclosure Vol. 170, No. 17029, pp. 9-15 (Jun. 1978). The light-sensitive layer preferably has a pH value of not more than 7.

Examples of auxiliary layers which are optionally arranged on the light-sensitive material include a heating layer, an antistatic layer, an anticurl layer, a release layer, a cover sheet or a protective layer, a layer containing a bas or base precursor and a base barrier layer.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Preparations of liquid compositions and coating solutions of the components contained in the light-sensitive layer are described hereinbelow.

The silver haalide is preferably prepared in the form of a silver halide emulsion. Various processes for the preparation of the silver haide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publications Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivative; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of improving high or low intensity reciprocity law failure, a water soluble iridium salt, e.g., iridium (III) or (IV) chloride, or ammonium hexachloroiridate, or a water soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added in the course of the preparation of the emulsion. When the organic silver salts are introduced in the light-sensitive microcapsule, the emulsion of the organic silver salts can be prepared in the same manner as in the preparation of the silver halide emulsion.

In the preparation of the light-sensitive material, the polymerizable compound (the term, "polymerizable compound" includes the photo polymrizable composition and photo polymerizable compound) is used as the mecium for preparation of the liquid composition containing another component of the light-sensitive layer. For example, the silver halide, (including the silver halide emulsion), the reducing agent or the color image forming substance can be dissolved, emulsified or dispersed in the polymerizable compound to prepare the light-sensitive material. Especially, the color image forming substance is preferably incorporated into the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

Instead of employing the above polymer, the light-sensitive composition can be prepared by dispersing the microcapsules having the silver halide emulsion as core material in the emulsion of the polymerizable compound.

The polymerizable compound (including the light-sensitive composition) are preferably emulsified in an aqueous medium to prepare the coating solution. The necessary components for preparation of the microcapsule, such as shell material can be incorporated into the emulsion. Further, other components such as the reducing agent can be added to the emulsion. The emulsion of the polymerizable compound can be processed for forming shell of the microcapsule.

Examples of the process for preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Patent No. 990,443 and Japanese Patent Publications Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using ureaformaldehyde or urea-formaldehyde-resorcinol wall-forming materials are described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Patent No. 867,797 and U.S. Pat. No. 4,001,140; an electrolytic dispersion and cooling process as described in U.K. Patents Nos. 952,807 and 965,074; a spray-drying process as described in U.S. Pat. No. 3,111,407 and U.K. Patent No. 930,422; and the like. It is preferable, though not limitative, that the microcapsule is prepared by emulsifying core materials containing the polymerizable compound and forming a polymeric membrane (i.e., shell) over the core materials.

When the dispersion containing microcapsules has been prepared in the above mentioned manner, the fine polymer particles of the present invention, and other optional components are added to obtain a coating solution for preparation of the light-sensitive layer.

The light-sensitive material of the invention can be prepared by coating and drying the above-prepared coating solution on a support. The process for coating the coating solution on a support can be easily carried out in the conventional manner.

The image-receiving material is described hereinbelow.

Examples of the material employable as the support of the image-receiving material include baryta paper in addition to various examples which can be employed as the support of the known light-sensitive material. In the case that a porous material, such as paper is employed as the support of the image-receiving material, the porous support preferably has such a surface characteristic that a filtered maximum waviness of not less than 4 $\mu$m is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is prepared by providing an image-receiving layer on a support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$·cm/cm$^2$·sec·cmHg can be used as the binder to protect the color of the image formed on the image-receiving material.

The image-receiving layer can contain a granulated thermoplastic compound to obtain a glossy image. There is no specific limitation with respect to the thermoplastic compound. The thermoplastic compound include known plastic resin and wax. The thermoplastic resin preferably has a glass transition temperature of not more than 200° C. The wax preferably has a melting point of not more than 200° C.

A photopolymerization initiator or a thermalpolymerization initiator can be contained in the image-receiving layer to polymerize the transferred upolymerized polymerizable compound, so that the obtained image is fixed on the image-receiving layer.

A dye or pigment can be contained in the image-receiving layer for the purpose of entering letters, symbols, frames etc. in the image-receiving layer, or of giving a certain color to the background of the image. Further, the dye or pigment can be also employed for the purpose of making it easy to distinguish the sides of the image-receiving material. In the case that it is possible that the dye or pigment disturbs the image formed on the image-receiving layer, it is preferred that the density of the dye or pigment is low (e.g. reflection density of not higher than 1), or the dye or pigment has a property of being decolored when it is heated or irradiated with light.

Further, when a white pigment, such as titanium dioxide, barium sulfate etc. is contained in the image-receiving layer, the image-receiving layer can function as a white reflection layer. In this case, the white pigment is used in an amount of from 10 g to 100 g based on 1 g of the thermoplastic material.

The above-mentioned dye and pigment can be either uniformly or partially contained in the image-receiving layer. For example, when the support is composed of transparent material, the white pigment can be partially contained in the image-receiving layer to make a part of a reflection image to be transparent. Thus, information of the image which is unnecessary in a transparent image can be entered in the part of the image-receiving layer containing the white pigment as the reflection image.

The image-receiving layer can be composed of two or more layers according to the above-mentioned functions. The thickness of the image-receiving layer preferably ranges from 1 to 100 $\mu$m, more preferably from 1 to 20 $\mu$m.

A protective layer can be provided on the surface of the image-receiving layer. A layer containing a granulated thermoplastic compound can be also provided on the image-receiving layer.

A layer containing an adhesive and a release paper can be provided in the order on the support of the image-receiving material on the opposite side of the image-receiving layer.

The above-described components of the image-receiving layer are dissolved, emulsified or dispersed in an aqueous medium to prepare the coating solution. The image-receiving material can be prepared by coating and drying the coating solution on a support in the conventional manner.

Various image recording apparatus can be used for the image-forming method. An example of the apparatus comprises an exposure device for imagewize exposing the light-sensitive material to form a latent image, a heat development device for fixing the area corresponding to the latent image, a transfer device for pressing the developed light-sensitive material on the image-receiving material. Another example of the apparatus comprises an fixing apparatus for irradiating, pressing or heating the image-receiving material on which an image has been transferred in addition to the above-mentioned devices.

The present invention is further described by the following examples without limiting the invention.

EXAMPLE 1

Preparation of silver halide emulsion

In 1,200 ml of water were dissolved 25 g of gelatin and 3 g of sodium chloride, and the resulting gelatin solution was kept at 70° C. To the gelatin solution, 600 ml of an aqueous solution containing 117 g of potassium bromide and 600 ml of an aqueous solution containing 0.74 mole of silver nitrate were added simultaneously at the same feed rate over a period of 45 minutes. Further, after 5 minutes, to the resulting mixture were added 200 ml of an aqueous solution containing 4.3 g of potassium iodide at the same feed rate over 5 minutes.

The emulsion was washed for desalting, and to the emulsion was added 24 g of gelatin while stirring at 50° C. for 15 minutes to obtain a silver halide emulsion. The yield of the emulsion was 1,000 g.

Preparation of W/O emulsion

In 100 g of trimethylolpropane triacrylate were dissolved 0.40 g of the following copolymr and 10.0 g of Pargascript Red I-6-B (tradename of Ciba-Geigy).

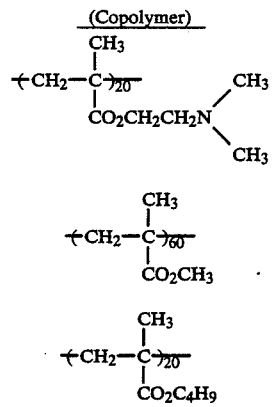

(Copolymer)

In 18.00 g of the solution was dissolved 0.36 g of the surface active agent (Nissan Nonion NS 208.5 produced by Nippon Oils & Fats Co., Ltd.), and was further added a solution in which 1.29 g of the following reducing agent (I) and 1.22 g of the following reducing agent (II) are dissolved in 4.0 g of methylene chloride to obtain an oily phsse (O).

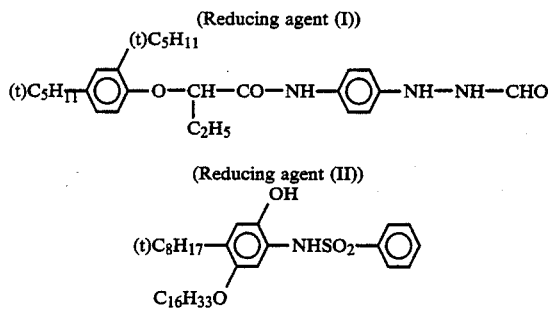

To 2.0 g of the silver halide emulsion were added 0.45 g of 10% aqueous solution of potassium bromide and 0.022 g of silver benzotriazole emulsion to obtain an aqueous phase (W).

Further, to the oily phase (O) was added the aqueous phase (W), and the mixture was stirred at 15,000 r.p.m. using homogenizer for 5 minutes to obtain W/O emulsion.

Preparation of light-sensitive microcapsule

To 30 g of 4.5% aqueous solution of partial sodium salt of polyvinylbenzene sulfonic acid (tradename VERSA TL 500 produced by National Starch Corp.) was added 30 g of 4.5% aqueous solution of pectin. The solution was mixed and then adjusted to pH 4.0 using 20% aqueous solution of sodium hydroxide. The W/O emulsion was added to the obtained solution, and the mixture was stirred at 7,000 r.p.m. for 2 minutes using a homogenizer to obtain W/O/W emuslion.

To 72.5 g of the W/O/W emulsion were added 8.32 g of 40% aqueous solution of urea, 3.19 g of 10% aqueous solution of resorcinol. 8.56 g of 37% aqueous solution of formaldehyde and 2.4 g of 10% aqueous solution of ammonium sulfate in order, and the resulting mixture was heated at 60° C. for 2 hours while stirring. The mixture was adjusted to pH 7.0 using 20% aqueous solution of dipotassium hydrogenphosphate. To the resulting mixture was added 3.73 g of 30% aqueous solution of sodium hydrogen sulfite to obtain a dispersion containing light-sensitive microcapsule having a shell of ures-fromaldehyde resin (mean particle diameter: 7 $\mu$m).

Preparation of light-sensitive material

To 10.0 g of the microcapsule dispersion were added 1.0 g of 1% aqueous solution of a surface active agent (tradename "Nissan Nonion NS 208.5" produced by Nippon Oils & Fats Co., Ltd), 1.8 g of 10% solution (solvent: water/ethanol=50/50 as volume ratio) of guanidine trichroloacetate, and 0.9 g of polyethylene powder (antismudging agent, tradename "Furosen UF-80", mean particle size: 15 $\mu$m, melting point: 107° C., produced by Seitetsu Kagaku Kogyo Co., Ltd. ) to obtain a coating dispersion. The coating dispersion was coated on a polyethylene terephthalate film having a thickness of 100 $\mu$m in coating amount of 35 cc/m$^2$ and dried to obtain a light-sensitive material (A).

Preparation of image-receiving material

To 125 g of water was added 11 g of 40% aqueous solution of sodium hexametaphosphate, and were further added 34 g of zinc 3,5-di-$\alpha$-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform. The mixture was then uniformly coated on an art paper having basis weight of 43 g/m$^2$ to give a layer having a wet thickness of 30 $\mu$m and dried to obtain an image-receiving material.

Image formation and evaluation

The light-sensitive material (A) was exposed to light all over the light-sensitive layer using a tungsten lamp at 2,000 lux for 1 second through a filter having a maximum density of 4.0 and a minimum density of 0.1, and then heated on a hot plate at 125° C. for 30 seconds.

The exposed and heated light-sensitive material was then combined with the image-receiving material (A) and passed through a press roll at pressure of 300 kg/cm$^2$ and at temperature of 100° C. to obtain a magenta positive image on the image receiving material. The minimum density (in the exposed area) and the maximum density (in the unexposed area) in the obtained image was measured using a reflection densitometer.

The color development produced in a white ground part on the image-receiving material was observed with the naked eye.

The results are set forth in Table 1.

EXAMPLE 2

Preparation of light-sensitive microcapsule

To 30 g of 4.5% aqueous solution of partial sodium salt of polyvinylbenzene sulfonic acid (tradename "VERSA TL 500" produced by National Starch Corp.) was added 30 g of 4.5% aqueous solution of pectin. The solutions were mixed and then adjusted to pH 6.0 using 20% aqueous solution of sodium hydroxide. The W/O emulsion prepared in Example 1 was added to the solution, and the mixture was stirred at 7,000 r.p.m. for 2 minutes using a homogenizer to obtain W/O/W emulsion.

Independently, a mixture of 13.2 g of melamine, 21.6 g of 37% aqueous solution of formaldehyde and 70.8 g of water was stirred at 60° C. for 30 minutes to give a transparent melamine-formaldehyde precondensate solution.

To the above W/O/W emulsion was added 10 g of the precondensate solution. The resulting mixture was then adjusted to pH 6.0 using 20% aqueous solution of phosphoric acid while stirring. The mixture was heated to 60° C. for 90 minutes to obtain a microcapsule dispersion.

The microcapsule dispersion was adjusted to pH 3.8 using 20% aqueous solution of phosphoric acid, and then to the dispersion was added 6.3 g of 40% aqueous solution of urea to remove residual formaldehyde. The dispersion was stirred for 40 minutes at 60° C. to obtain a dispersion containing light-sensitive microcapsules having a shell of melamine-formaldehyde resin (mean particle diameter: 7 μm).

Preparation of light-sensitive material

To 10.0 g of the microcapsule dispersion were added 1.0 g of 10% aqueous solution of a surface active agent (tradename "Nissan Nonion NS 208.5" produced by Nippon Oils & Fats Co., Ltd.), 2 g of 10% aqueous solution (solvent: water/ethanol=50/50 as volume ratio) of guanidine trichloroacetate, and 0.9 g of polyethylene powder (antismudging agent, tradename "Furosen UF-4", mean particle size: 15 μm, melting point: 115° C., produced by Seitetsu Kagaku Kogyo Co., Ltd.) to obtain a coating dispersion. The coating dispersion was coated on a polyethylene terephthalate film in coating amount of 35 cc/m², and dried at an ambient temperature to obtain a light-sensitive material (B).

COMPARISON EXAMPLE 1

Preparation of light-sensitive material

A light-sensitive material (C) was prepared in the same manner as in Example 1, except that polyethylene powder (i.e., antismudging agent) was not used in the preparation of the light-sensitive material.

COMPARISON EXAMPLE 2

Preparation of light-sensitive material

A light-sensitive material (D) was prepared in the same manner as in Example 1, except that fine particles of starch (tradename KF-5, produced by Shinshin Shokuryo Kogyo Co., Ltd.) were used instead of polyethylene powder as antismudging agent.

Image formation and evaluation

Images were formed and evaluated in the same manner as in Example 1.

The results are set forth in Table 1. In Table 1, color Staining indicates whether the color staining in the white back ground part of the obtained image is observed (+) or not (−).

TABLE 1

| Light-Sensitive Material | Maximum Optical Density | Minimum Optical Density | Color Staining |
|---|---|---|---|
| (A) | 1.25 | 0.08 | (−) |
| (B) | 1.31 | 0.09 | (−) |
| (C) | 1.27 | 0.15 | (+) |
| (D) | 1.00 | 0.08 | (−) |

It is apparent from the results in Table 1 that in the image-forming methods according to the present invention, an image having a high maximum optical density and a low minimum optical density which is remarkably reduced in the occurrence of the color staining is obtained.

In the image-forming methods employing the light-sensitive materials containing no antismudging agent, the color staining is observed in a white background part of the image and the image has high minimum density. Further, in the image-forming method employing the light-sensitive material containing particles of starch as the antismudging agent, the maximum optical density lowers because of decrease of transferred unpolymerized polymerizable compound.

What is claimed is:

1. An image-forming method which comprises the steps of:
    (A) imagewise exposing to light a light-sensitive material which comprises a light-sensitive layer provided on a support, wherein said light-sensitive layer contains:
        (i) microcapsules which contain:
            (a) a silver halide,
            (b) a reducing agent, and
            (c) an ethylenically unsaturated polymerizable compound, and
        (ii) fine polymer particles having a mean particle size in the range of 5 to 50 μm and a softening point in the range of 80 to 180° C.,
    so as to form a latent image of the silver halide in the light-sensitive layer;
    (B) simultaneously or thereafter heating the light-sensitive material at a temperature in the range of 80° to 200° C. to imagewise polymerize the ethylenically unsaturated polymerizable compound in the light-sensitive layer; and
    (c) pressing, at a pressure in the range of 30 to 500 kg/cm² and at a temperature in the range of 40° to 180° C., the light-sensitive material on an image-receiving material comprising an image-receiving layer provided on a support, under the condition that the light-sensitive layer of the light-sensitive material faces the image-receiving layer of the image-receiving material, so as to deform or melt the fine polymer particles and so as to transfer the unpolymerized ethylenically unsaturated polymerizable compound to the image-receiving material.

2. The image-forming method as claimed in claim 1, wherein the fine polymer particles are polyolefin particles.

3. The image-forming method as claimed in claim 1, wherein the fine polymer particles are contained in the light-sensitive layer in an amount of 1 to 100 weight parts based on 100 weight parts of the microcapsules.

4. The image-forming method as claimed in claim 1, wherein the fine polymer particles have a specific gravity in the range of 0.9 to 1.3.

5. The image-forming method as claimed in claim 1, wherein the microcapsules have a shell made of aminoaldehyde resin.

6. The image-forming method as claimed in claim 1, wherein a color image forming substance is contained in the microcapsules.

7. The image-forming method as claimed in claim 1, wherein the light-sensitive material is pressed on the image-receiving material at a pressure in the range of 100 to 400 kg/cm$^2$.

8. The image-forming method as claimed in claim 1, wherein the light-sensitive material is pressed on the image-receiving material at a temperature in the range of 80° to 140° C.

9. The image-forming method as claimed in claim 1, wherein the light-sensitive material is heated at a temperature in the range of 100° to 160° C. so as to imagewise polymerize the ethylenically unsaturated polymerizable compound.

* * * * *